(12) United States Patent
Williams et al.

(10) Patent No.: US 8,097,179 B2
(45) Date of Patent: Jan. 17, 2012

(54) METHOD FOR ABATING EFFLUENT FROM AN ETCHING PROCESS

(75) Inventors: Michael Williams, Gresham, OR (US); Michael Barthman, Boring, OR (US)

(73) Assignee: LSI Corporation, Milpitas, CA (US)

( * ) Notice: Subject to any disclaimer, the term of this patent is extended or adjusted under 35 U.S.C. 154(b) by 375 days.

(21) Appl. No.: 12/502,057

(22) Filed: Jul. 13, 2009

(65) Prior Publication Data
US 2009/0275204 A1   Nov. 5, 2009

Related U.S. Application Data

(62) Division of application No. 09/942,330, filed on Aug. 29, 2001, now Pat. No. 7,578,883.

(51) Int. Cl.
*B44C 1/22* (2006.01)

(52) U.S. Cl. .......... 216/58; 423/210; 438/706; 438/714; 216/67

(58) Field of Classification Search .................. None
See application file for complete search history.

(56) References Cited

U.S. PATENT DOCUMENTS

| | | | |
|---|---|---|---|
| 2,245,145 A | 6/1941 | Hall et al. | |
| 3,425,810 A | 2/1969 | Scott, Jr. | |
| 3,607,000 A | 9/1971 | Beal et al. | |
| 3,702,619 A | 11/1972 | Son | |
| 3,703,798 A | 11/1972 | Pretorius et al. | |
| 3,722,185 A | 3/1973 | Miczek | |
| 3,746,515 A | 7/1973 | Friedman | |
| 4,311,671 A | 1/1982 | Notman | |
| 4,411,877 A | 10/1983 | Notman | |
| 4,482,523 A | 11/1984 | Peterson | |
| 4,747,367 A | 5/1988 | Posa | |
| 4,968,336 A * | 11/1990 | Reimanis et al. | 96/246 |
| 4,999,302 A | 3/1991 | Kahler et al. | |
| 5,011,520 A | 4/1991 | Carr et al. | |
| 5,137,701 A | 8/1992 | Mundt | |
| 5,384,051 A | 1/1995 | McGinness | |
| 5,486,339 A | 1/1996 | Bizzotto | |
| 5,573,663 A | 11/1996 | Junius et al. | |
| 5,593,548 A | 1/1997 | Yeoman et al. | |
| 5,756,048 A | 5/1998 | Zardi et al. | |
| 6,333,010 B1 * | 12/2001 | Holst et al. | 422/171 |
| 6,423,284 B1 * | 7/2002 | Arno et al. | 423/240 R |
| 6,689,252 B1 * | 2/2004 | Shamouilian et al. | 204/157.15 |
| 7,578,883 B1 * | 8/2009 | Williams et al. | 118/715 |

OTHER PUBLICATIONS

Tonnis et al., J. Vac. Sci. Tech. A18(2), 2000, pp. 393-399.*

* cited by examiner

*Primary Examiner* — Lan Vinh
*Assistant Examiner* — Jiong-Ping Lu
(74) *Attorney, Agent, or Firm* — Cochran Freund & Young LLP

(57) ABSTRACT

A method for abating effluent from an etching process in one embodiment includes advancing etch gas product into a passageway of a gas connector in direct fluid communication with a first chamber of an interior void of an apparatus, advancing a gas from a gas source into said passageway of said gas connector at the same time said etch gas product is being advanced into said passageway, and advancing humidified gas from a humidified gas source into a second chamber of said interior void.

16 Claims, 3 Drawing Sheets

METHOD FOR ABATING EFFLUENT FROM AN ETCHING PROCESS

This application is a divisional of co-pending prior application Ser. No. 09/942,330 filed Aug. 29, 2001, the entire contents of which are incorporated by reference.

TECHNICAL FIELD

The present invention relates generally to a method for abating effluent from a process, and more particularly to an arrangement and method for abating effluent from an etching process.

BACKGROUND

The fabrication of semiconductor wafers can include the use of an etching process. An etching process is utilized to remove materials from the surface of a semiconductor wafer, or from films deposited on the wafer, through exposure to a highly reactive chemical species present in an etch reactor. Through the etch process, selected materials are removed from the wafer or film, which shapes the profile and critical dimensions of the remaining materials. The material remaining on the semiconductor wafer can thus become, for example, an operating transistor component, or be used to wire transistors together and thereby produce a functional semiconductor device.

The chemical reactions taking place during the etch process can release various gaseous byproducts into the etch reactor, e.g. aluminum chloride and/or boron oxide. In order to remove these gaseous byproducts, the etch reactor is typically in fluid communication with a device such as a wet scrubber. In particular, the effluent from the etch process which contains the gaseous by products is advanced from the etch reactor to the wet scrubber via a number of pipes. The wet scrubber then removes the byproducts from the etch process effluent. However, a problem with the above described arrangement is that some gaseous byproducts contained in the effluent can precipitate out in the pipes prior to reaching the wet scrubber. This precipitation can obstruct the pipes and thus prevent effluent from reaching the wet scrubber. Therefore, the etching process must be stopped and the pipes cleaned out before additional etching can take place. Stopping the etching process and cleaning the pipes is time consuming and expensive and thus decreases the efficiency of semiconductor wafer fabrication.

An additional problem with the above described arrangement is that many scrubbers are fabricated from stainless steel components and the etch process effluent tends to corrode these components. Therefore, after a certain amount of time these scrubbers must be replaced. The replacement of these scrubbers is also time consuming and expensive and thus further decreases the efficiency of semiconductor wafer fabrication.

Thus, a continuing need exists for an arrangement and method for abating effluent from an etching process which address one or more of the above described problems.

SUMMARY

In accordance with one embodiment of the present invention, there is provided a method of abating an etch gas product generated from an etch apparatus. The method includes placing the etch apparatus in fluid communication with an apparatus which has (i) an enclosure which defines an interior void, (ii) a first partition having a first orifice defined therein, the first partition being positioned within the interior void of the enclosure such that (A) the first partition divides the interior void into a first chamber and a second chamber and (B) the first orifice is in fluid communication with the first chamber and the second chamber, (iii) a gas connector which has (A) a passageway defined therethrough, the passageway having an inlet and an outlet and being in direct fluid communication with the first chamber of the interior void and (B) a gas port in fluid communication with the passageway, (iv) a gas dispenser in direct fluid communication with the second chamber of the interior void, (v) an exit port in fluid communication with the interior void of the enclosure, (vi) a gas source containing a gas, the gas source being in fluid communication with the gas port of the gas connector such that the gas contained by the gas source is advanced into the passageway of the gas connector, and (vii) a humidified gas source for providing a humidified gas, the humidified gas source being in fluid communication with the gas dispenser such that the humidified gas is advanced into the gas dispenser and directly into the second chamber of the interior void. The method also includes advancing the etch gas product into the passageway of the gas connector. The method further includes advancing the gas from the gas source into the passageway of the gas connector at the same time the etch gas product is being advanced into the passageway. The method still further includes advancing the humidified gas from the humidified gas source into the second chamber of the interior void.

In accordance with another embodiment, a method of abating effluent includes generating an etch gas product in an etching apparatus, advancing the etch gas product along a gas connector in fluid communication with the etching apparatus and in fluid communication with an abatement apparatus, introducing a first gas into the advancing etch gas product within the gas connector, mixing the introduced first gas and the advancing etch gas product within the gas connector, advancing the mixed first gas and etch gas product into an interior void of the abatement apparatus, precipitating a first portion of the mixed first gas and etch gas product within the interior void, and mixing a second gas with the mixed first gas and etch gas product within the interior void after the first portion has been precipitated.

In accordance with a further embodiment, a method of abating effluent includes generating an etch gas product in an etching apparatus, advancing the etch gas product along a gas connector in fluid communication with the etching apparatus and in fluid communication with an abatement apparatus, introducing a first gas into the advancing etch gas product within the gas connector, mixing the introduced first gas and the advancing etch gas product within the gas connector, advancing the mixed first gas and etch gas product into a first chamber of the abatement apparatus, precipitating all but a first remainder of the mixed first gas and etch gas product within the first chamber, advancing the first remainder from the first chamber to a second chamber of the abatement apparatus through a first orifice having a first central axis, humidifying a second gas, mixing the humidified second gas with the first remainder within the second chamber, precipitating all but a second remainder of the mixed humidified second gas and first remainder within the second chamber, and advancing the second remainder from the second chamber to a third chamber of the abatement apparatus through a second orifice having a second central axis.

The above and other objects, features, and advantages of the present invention will become apparent from the following description and the attached drawings.

DETAILED DESCRIPTION

Figure 1:
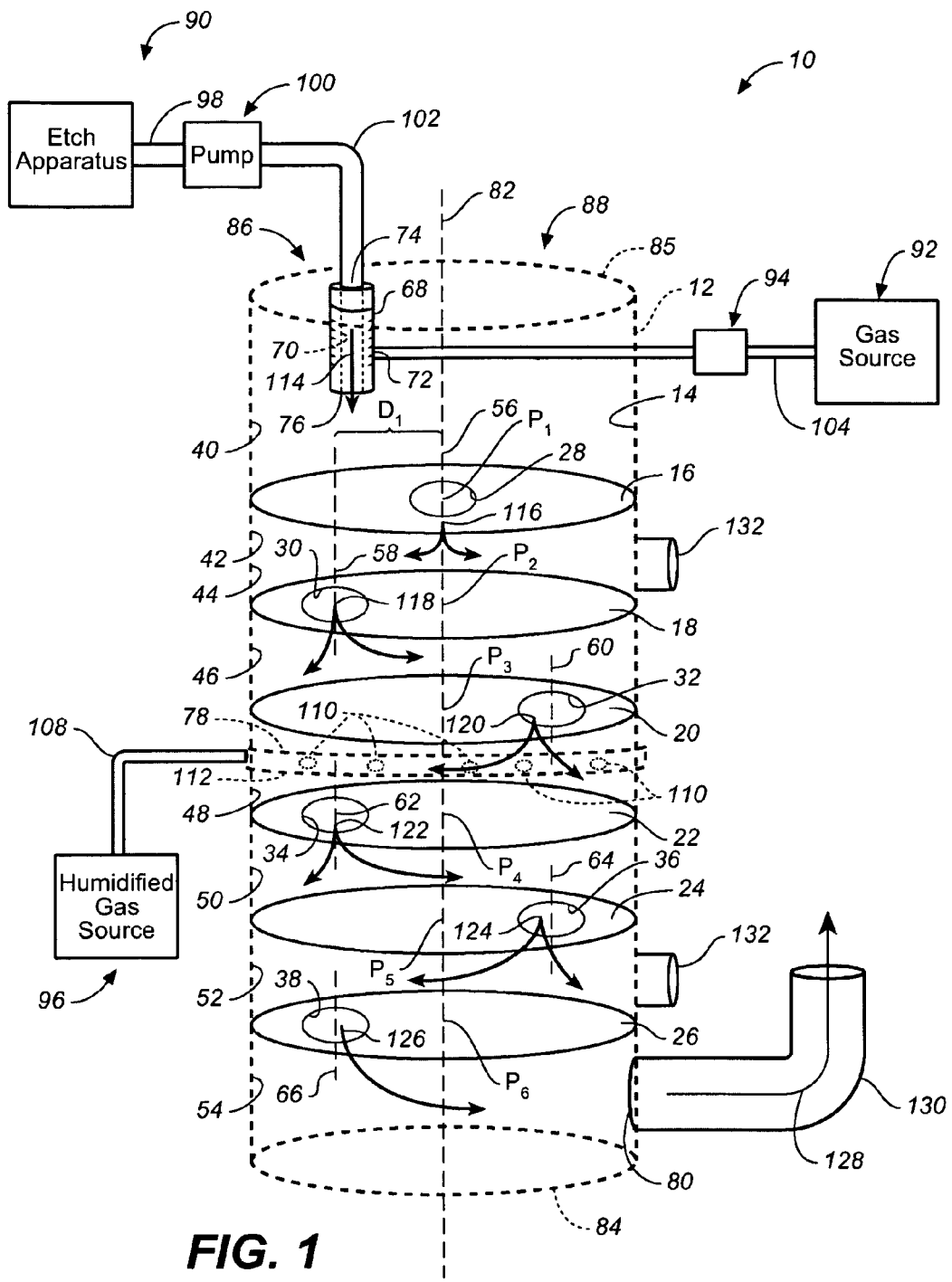
FIG. 1. is a partial schematic view of one embodiment of an arrangement for abating effluent from an etching process which incorporates various features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Now referring to FIG. 1, there is shown one exemplary embodiment of a process effluent abatement arrangement 10 which incorporates the features of the present invention therein. In particular, arrangement 10 can be utilized to abate effluent generated from an etching process. More particularly, arrangement 10 can be utilized to abate effluent generated from a metal etching process employed in the fabrication of semiconductor wafers.

Still referring to FIG. 1, arrangement 10 includes an enclosure 12 which defines an interior void 14. Enclosure 12 also has an end wall 84 and an end wall 85. As will be discussed in greater detail below, arrangement 10 also includes a number of partitions 16, 18, 20, 22, 24, and 26 positioned within interior void 14. Arrangement 10 further includes a gas connector 68 which has (i) a passageway 70 defined therethrough and (ii) a gas port 72 in fluid communication with passageway 70. Passageway 70 has an inlet 74 and an outlet 76. Gas connector 68 can be a commercially available KF-40 SS manifold. Passageway 70 is in fluid communication with interior void 14. Arrangement 10 also includes a gas dispenser 78 which is in fluid communication with interior void 14. Arrangement 10 further includes an exit port 80 in fluid communication with interior void 14. Arrangement 10 also includes a number of inspection ports 132 which allow visual inspection of interior void 14. Inspection ports 132 can be 2″ PVC caps attached to enclosure 12 such that the caps allow the visual inspection of interior void 14. In addition, arrangement 10 includes a pipe 130 which is in fluid communication with (i) exit port 80 and (ii) a facility exhaust system (not shown). Arrangement 10 further includes an etch apparatus 90, a gas source 92, a heating element 94, and a humidified gas source 96.

With respect to partitions 16, 18, 20, 22, 24, and 26, each partition is positioned within interior void 14 of enclosure 12. In particular, partition 16 is positioned within interior void 14 such that (i) partition 16 divides interior void 14 into a first chamber 40 and a second chamber 42 and (ii) a longitudinal axis 82 of enclosure 12 passes through a center point $P_1$ of partition 16. Each partition 18, 20, 22, 24, and 26 is positioned within second chamber 42. In particular, each partition 18, 20, 22, 24, and 26 is spaced apart along longitudinal axis 82 of enclosure 12 so that longitudinal axis 82 passes through a center point $P_2$ of partition 18, a center point $P_3$ of partition 20, a center point $P_4$ of partition 22, a center point $P_5$ of partition 24, and a center point $P_6$ of partition 26. Furthermore, it is preferable that partition 18, partition 20, partition 22, partition 24, and partition 26 all be positioned within second chamber 42 such that second chamber 42 is divided into a sub-chamber 44, a sub-chamber 46, a sub-chamber 48, a sub-chamber 50, a sub-chamber 52, and a sub-chamber 54. Specifically, partitions 18, 20, 22, 24, and 26 are positioned in second chamber 42 in the following manner. Partition 18 is positioned adjacent to partition 16 such that sub-chamber 44 is interposed between partition 16 and partition 18. Partition 20 is positioned adjacent to partition 18 such that sub-chamber 46 is interposed between partition 18 and partition 20. Partition 22 is positioned adjacent to partition 20 such that sub-chamber 48 is interposed between partition 20 and partition 22. Partition 24 is positioned adjacent to partition 22 such that sub-chamber 50 is interposed between partition 22 and partition 24. Partition 26 is positioned adjacent to partition 24 such that sub-chamber 52 is interposed between partition 24 and partition 26. End wall 84 of enclosure 12 is positioned adjacent to partition 26 such that sub-chamber 54 is interposed between end wall 84 and partition 26.

Still referring to FIG. 1, it should be understood that each partition 16, 18, 20, 22, 24, and 26 has an orifice defined therein. In particular, partition 16 has an orifice 28 defined therein, partition 18 has an orifice 30 defined therein, partition 20 has an orifice 32 defined therein, partition 22 has an orifice 34 defined therein, partition 24 has an orifice 36 defined therein, and partition 26 has an orifice 38 defined therein. With respect to the relative position of each orifice it should be appreciated that each orifice has a central axis. In particular, orifice 28 has a central axis 56, orifice 30 has a central axis 58, orifice 32 has a central axis 60, orifice 34 has a central axis 62, orifice 36 has a central axis 64, and orifice 38 has a central axis 66.

Furthermore, central axis 56 of orifice 28 is aligned with longitudinal axis 82, central axis 58 of orifice 30 is offset relative to central axis 56 of orifice 28, central axis 60 of orifice 32 is offset relative to central axis 58 of orifice 30, central axis 62 of orifice 34 is offset relative central axis 60 of orifice 32, central axis 64 of orifice 36 is offset relative central axis 62 of orifice 34, and central axis 66 of orifice 38 is offset relative central axis 64 of orifice 36. What is meant herein by one central axis being "offset" from another central axis is that the two central axes are not linearly aligned and are thus spaced apart from each other. For example, as shown in FIG. 1, central axis 58 is spaced apart from central axis 56 by a distance $D_1$. In addition, it should be understood that longitudinal axis 82 divides enclosure 12 into a first half 86 and a second half 88 and orifice 30, orifice 34, and orifice 38 are located in first half 86 while orifice 32 and orifice 36 are located in second half 88.

It should be understood that preferably, orifice 28 is in direct fluid communication with first chamber 40 and sub-chamber 44 (and thus second chamber 42), orifice 30 is in direct fluid communication with sub-chamber 44 and sub-chamber 46, orifice 32 is in direct fluid communication with sub-chamber 46 and sub-chamber 48, orifice 34 is in direct fluid communication with sub chamber 48 and sub-chamber 50, orifice 36 is in direct fluid communication with sub-chamber 50 and sub-chamber 52, and orifice 38 is in direct fluid communication with sub-chamber 52 and sub-chamber 54. What is meant herein by an orifice being "in direct fluid communication" is that a fluid, such as a gas, can flow from the first location through the orifice and immediately be located within the second location without having to be advanced through any intervening locations (e.g. sub-chambers). For example, orifice 28 is in direct fluid communication with first chamber 40 and sub-chamber 44, therefore as a fluid flows from first chamber 40 it immediately passes through orifice 28 and then immediately enters sub-chamber 44 (and thus second chamber 42) and does not pass through any intervening chambers. This is in contrast to, for example, the relationship between orifice 28 and sub-chamber 46 which are in fluid communication, but not in direct fluid communication since a fluid has to pass through sub-chamber 44 and orifice 30 before entering sub-chamber 46.

Figure 2:
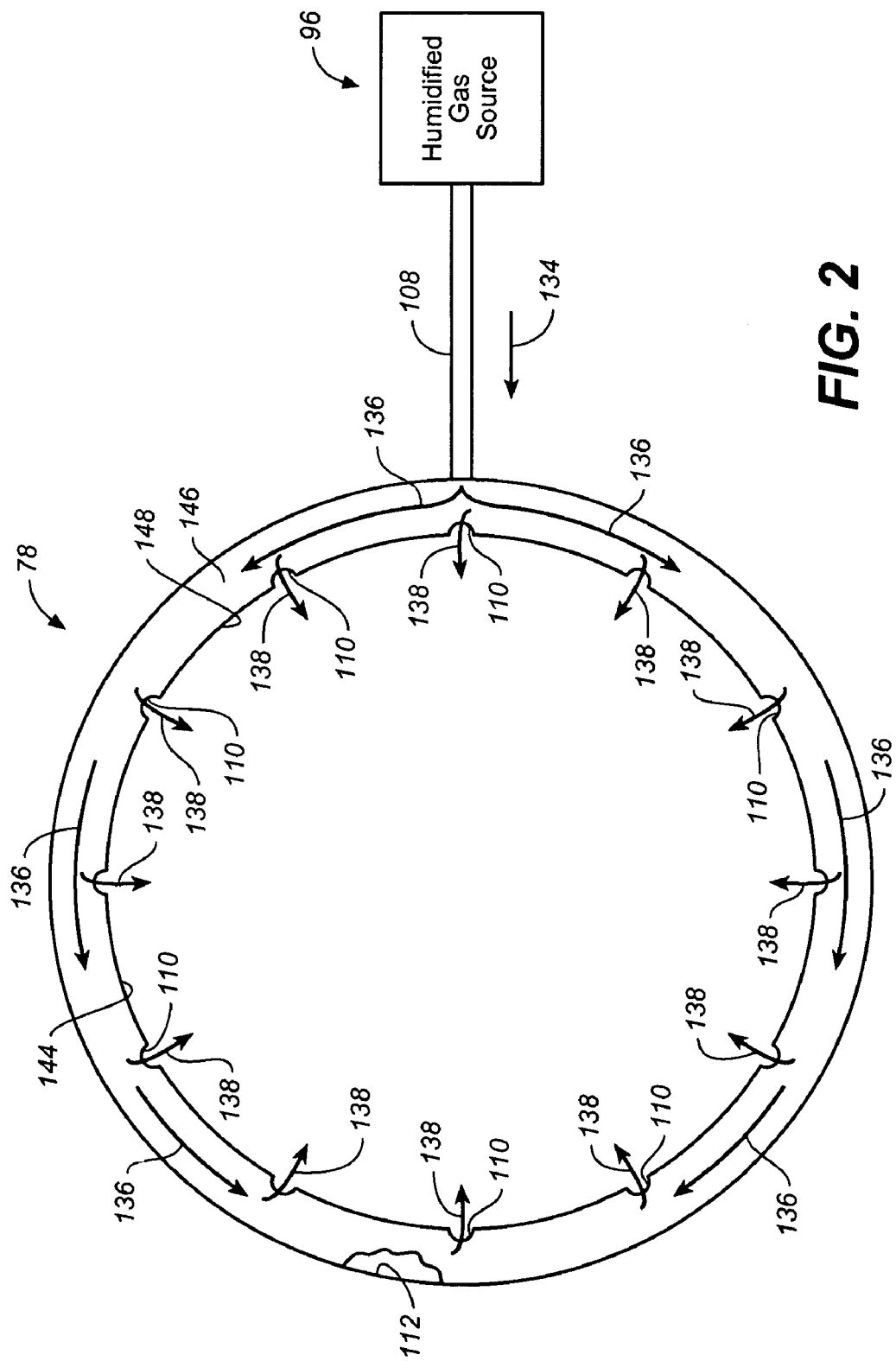
FIG. 2. is a top view of an exemplary gas dispenser of the arrangement shown in FIG. 1, note that the gas dispenser is shown removed from the enclosure of the arrangement of FIG. 1 and is shown schematically coupled to a humidified gas source of the arrangement of FIG. 1.
Figure 3:
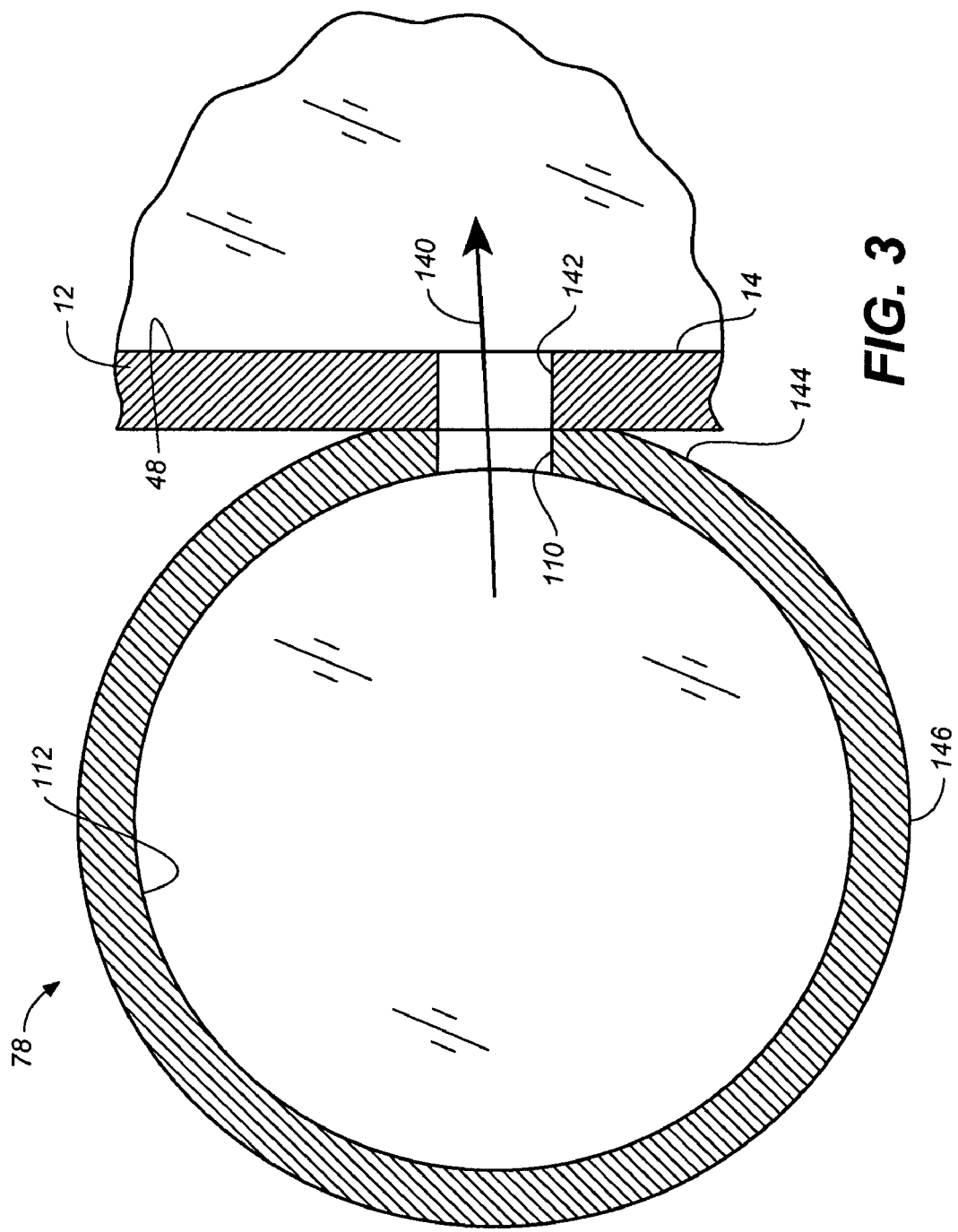
FIG. 3 is a transverse cross sectional view of the gas dispenser of FIG. 2 secured to a fragmentary cross sectional view of the enclosure of the arrangement of FIG. 1.

Now referring to FIG. 2, gas dispenser 78 includes a ring member 146 which defines a hole 144. Ring member 146 also has (i) a lumen 112 defined therein and (ii) a number of exit holes 110 defined on an interior surface 148. Each exit hole 110 is in fluid communication with lumen 112. Gas dispenser 78 is positioned relative to enclosure 12 so that enclosure 12 is located within hole 144 as shown in FIG. 1. Note that gas dispenser 78 is shown in phantom in FIG. 1 for clarity of description. As shown in FIG. 3, gas dispenser 78 is specifically placed relative to enclosure 12 so that each exit hole 110 defined in ring member 146 is aligned with an entrance hole 142 defined in enclosure 12. Note that only one exit hole 110 and one entrance hole 142 is shown in FIG. 3. However, it should be understood that, preferably, there are a plurality of exit holes 110 and entrance holes 142 defined in ring member 146 and enclosure 12, respectively, and that ring member 146 is positioned relative to enclosure 12 such that each exit hole 110 is aligned with an entrance hole 142 as shown in FIG. 3. It should be appreciated that positioning exit holes 110 and entrance holes 142 in the above described manner places lumen 112 in fluid communication with interior void 14 of enclosure 12 such that a fluid, such as a gas, can be advanced from lumen 112 into interior void 14 as indicated by arrow 140 of FIG. 3.

As shown in FIG. 1, it is preferable that gas dispenser 78 be positioned relative to enclosure 12 such that lumen 112 of gas dispenser 78 is in direct fluid communication with second chamber 42 of enclosure 12. In particular, it is preferable that gas dispenser 78 be positioned relative to enclosure 12 such that lumen 112 of gas dispenser 78 is in direct fluid communication with sub-chamber 48 of enclosure 12. Note that the meaning of "direct fluid communication" is the same as discussed above.

Still referring to FIG. 1, etch apparatus 90 is in fluid communication with a pump 100 (e.g. a dry vacuum pump) via a conduit 98. Pump 100 is also connected to a conduit 102 which is in turn connected to gas connector 68. It should be appreciated that the above described arrangement places etch apparatus 90 in fluid communication with gas connector 68. It should also be appreciated that gas connector 68 is preferably placed in direct fluid communication (same meaning as discussed above) with first chamber 40 of enclosure 12 such that pump 10 can advance a fluid, such as a gas, from an etch reactor (not shown) of etch apparatus 90 directly into first chamber 40 of enclosure 12.

Gas source 92 is connected to conduit 104 which is in turn connected to gas port 72 of gas connector 68. In particular, conduit 104 places gas source 92 in fluid communication with passageway 70 of gas connector 68 such that a gas provided by gas source 92 can be advanced into passageway 70 of gas connector 68 via gas port 72. In addition, heating element 94 is placed in thermal communication with the gas provided by gas source 92 so that the gas is heated prior to being advanced into passageway 70 of gas connector 68. For example, heating element 94 may be an electrical heating element placed in contact with conduit 104 so that the electrical heating element heats the gas being advanced from gas source 92 prior to being advanced into passageway 70.

As shown in FIGS. 1 and 2, humidified gas source 96 is connected to a conduit 108 which is in turn connected to gas dispenser 78. In particular, conduit 108 places humidified gas source 96 in fluid communication with lumen 112 such that a humidified gas provided by humidified gas source 96 can be advanced from humidified gas source 96 and into lumen 112 as indicated by arrows 134 and 136 of FIG. 2. What is meant herein by a humidified gas is a gas that has gone through the process of humidification, that is, the process of increasing the water vapor content of the gas. In particular, humidification of a gas as used herein means purposefully adding a quantity of water vapor to the gas such that the water vapor content of the gas is greater than an amount which would normally occur in the gas. For example, the humidified gas can have a humidity of about 50% or more, for example about 70% humidity. One way of humidifying a gas which can be utilized in the present invention is to advance the gas through an aqueous bubbler prior to being advanced into lumen 112 of gas dispenser 78. It should be understood that one gas which can be utilized in the present invention for the humidified gas is humidified air.

During the operation of arrangement 10 effluent, such as a gas, generated by an etching process taking place in the etch reactor (not shown) is advanced into passageway 70 of gas connector 68 via conduits 98 and 102. In particular, pump 100 advances the gas from the etch reactor into passageway 70 of gas connector 68. The gas is then directly advanced into first chamber 40 of enclosure 12 in the direction indicated by arrow 114 as shown in FIG. 1. Note that pump 100 advances gas into first chamber 40 at a rate of about 50 sccms (standard cubic centimeters per minute). At the same time pump 100 is advancing gas into passageway 70, a gas is also advanced from gas source 92 into passageway 70 via conduit 104 and gas port 72 at about 20 psi. Furthermore, as previously mentioned, heating element 94 heats the gas being advanced from gas source 92 prior to it entering passageway 70. For example, heating element 94 can heat the gas being advanced into passageway 70 to about 90° C. An example of a gas which can be utilized to advance into passageway 70 is nitrogen.

It should be appreciated that heating the gas from gas source 92 prior to it entering passageway 70 and then mixing the heated gas with the gas from the etch reactor in passageway 70 ensures that chemical components present in the gas from the etch reactor remain in the gaseous state and do not precipitate out in passageway 70. Preventing the aforementioned chemical components from precipitating out in passageway 70 ensures that gas connector 68 remains open so that pump 100 can continue to advance gas or effluent from etch apparatus 90 into enclosure 12. This is in contrast to other arrangements which, as previously discussed, suffer from the chemical components precipitating out at inappropriate locations (e.g. prior to reaching the interior of the scrubber) and thus causing the etching process to be stopped.

After exiting passageway 70, the mixture of the gas from etch apparatus 90 and the gas from gas source 92 (herein after referred to as the mixture) enters first chamber 40 of enclosure 12. First chamber 40 has a greater volume than passageway 70 and therefore the mixture tends to cool once located within first chamber 40. As the mixture cools in first chamber 40 the various gaseous components contained within the mixture change from a gaseous form to a solid form as a result of the cooling process. In other words, a gaseous component contained within the mixture precipitates out of the mixture and is trapped as a solid within first chamber 40. For example, when a metal etch process is taking place in the etch reactor one gaseous component produced by this etch process is aluminum chloride. As discussed above, advancing the heated gas into passageway 70 ensures that the aluminum chloride substantially remains in the gaseous state until it is advanced into first chamber 40. Once advanced into first chamber 40, the aluminum chloride cools and precipitates out, for example, on the interior wall of first chamber 40 and on partition 16 thereby being trapped within first chamber 40 and being removed from the gaseous mixture.

The mixture then exits first chamber 40 and enters sub-chamber 44 (and therefore second chamber 42) via orifice 28 as indicated by arrows 116. The mixture further cools in sub-chamber 44 such that, if necessary, additional gaseous components precipitate out in sub-chamber 44 as described above with reference to first chamber 40. For example, additional aluminum chloride can precipitate out, and be trapped in, sub-chamber 44.

The mixture then exits sub-chamber 44 and enters sub-chamber 46 via orifice 30 as indicated by arrows 118. The mixture cools further in sub-chamber 46 such that additional gaseous components can precipitate out in sub-chamber 46 as described above with reference to first chamber 40. For example, additional aluminum chloride can also precipitate out, and be trapped in, sub-chamber 46.

The mixture then exits sub-chamber 46 and enters sub-chamber 48 via orifice 32 as indicated by arrows 120. The mixture continues to cool but is also exposed to, and mixed with, the humidified gas. In particular, as discussed above in reference to FIG. 2, humidified gas is advanced from humidified gas source 96 into lumen 112 in the directions indicated by arrows 134 and 136. The humidified gas is also advanced through exit holes 110 in the direction indicated by arrows 138. After advancing through exit holes 110, the humidified gas is advanced through entrance holes 142 in the direction indicated by arrow 140 (see FIG. 3) where it enters sub-chamber 48 and combines with the mixture.

Combining the humidified gas with the mixture causes additional gaseous components of the mixture to precipitate in sub-chamber 48. In particular, gaseous components present in the mixture which react with water will react with the water vapor present in the humidified gas and can thus form a precipitate which is trapped in sub-chamber 48. For example, when a metal etch process is taking place in the etch reactor another gaseous component produced by this etch process is boron oxide. Boron oxide reacts with the water vapor present in sub-chamber 48 so as to form boric acid which precipitates in sub-chamber 48 such that the boric acid is trapped in sub-chamber 48 thereby removing boron oxide from the mixture.

The mixture then exits sub-chamber 48 and enters sub-chamber 50 via orifice 34 as indicated by arrows 122. The mixture then exits sub-chamber 50 and enters sub-chamber 52 via orifice 36 as indicated by arrows 124. The mixture then exits sub-chamber 52 and enters sub-chamber 54 via orifice 38 as indicated by arrow 126. The mixture further cools and/or further reacts with the water vapor in sub-chambers 50, 52, and 54 such that additional gaseous components, e.g. aluminum chloride and/or boron oxide, are removed, i.e. precipitated from the mixture. It should be understood that having each orifice 28, 30, 32, 34, 36, and 38 offset from each adjacent orifice in the previously described manner helps to slow the advancement of the etch effluent through interior void 14 of enclosure 12 and thus enhances the efficiency at which gaseous components of the mixture are precipitated out.

The gaseous components remaining in the mixture then exit sub-chamber 54 via exit port 80 and are advanced through pipe 130 in the direction indicated by arrow 128. The mixture can then be subjected to further processing or vented depending upon the particular characteristics of the etch process being utilized.

In light of the above discussion, it should be appreciated that the present invention functions to abate the effluent generated by an etch process while substantially preventing the gaseous components thereof from precipitating out in inappropriate locations, e.g. in the duct work or conduits of the exhaust system. In particular, the present invention ensures that the gaseous components of the etch effluent precipitate out in an appropriate location, i.e. within interior void 14 of enclosure 12. By controlling where the gaseous components of the etch effluent precipitate in the above described manner, the present invention ensures that etch effluent continues to reach enclosure 12 and is not obstructed from entering interior void 14. Therefore, the etch process can continue without any of the above discussed interruptions thereby enhancing the efficiency of semiconductor wafer fabrication.

A number of etching process can take place before enclosure 12 needs to be cleaned or replaced. When enclosure 12 needs to be cleaned or replaced can be ascertained by visually inspecting interior void 14 via inspection ports 132. Once it is determined that enclosure 12 does require service it can be cleaned with water or simply replaced. To replace enclosure 12, enclosure 12 is removed from etch apparatus 90 so that enclosure 12 is no longer in fluid communication with etch apparatus 90 (note that no etching process should be taking place when enclosure 12 is removed from the etch apparatus 90). Enclosure 12 is also removed from gas source 92 and humidified gas source 96. A replacement enclosure (not shown) which is substantially identical to enclosure 12 and contains all the same components and has all the same advantages as discussed above is then placed in fluid communication with etch apparatus 90, gas source 92, and humidified gas source 96 in a substantially identical manner as described above. Etching with etch apparatus 90 can then continue in the above described manner with the replacement apparatus abating the effluent from the etch process in a substantially identical manner as described above in reference to FIGS. 1-3.

It should be appreciated that, preferably, enclosure 12 and partitions 16, 18, 20, 22, 24, and 26 are all fabricated from fiberglass and thus are relatively inexpensive. Therefore, it is commercially feasible to simply discard enclosure 12 and replace it with a new one which is quicker than attempting to clean the used enclosure. This is in contrast with other scrubber type devices which are typically fabricated from stainless steel which can be expensive and thus less likely to be discarded and therefore must be cleaned.

In addition, it should be appreciated that fiberglass as compared to stainless steel is relatively resistant to the chemicals which are produced by the etch processes. Therefore, the present invention does not suffer from the corrosion problems associated with using scrubbing devices fabricated from stainless steel.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

What is claimed is:

1. A method of abating an etch gas product generated from an etch apparatus, comprising:
   (a) placing said etch apparatus in fluid communication with an apparatus which includes (i) an enclosure which defines an interior void, (ii) a first partition having a first orifice defined therein, said first partition being positioned within said interior void of said enclosure such that (A) said first partition divides said interior void into a first chamber and a second chamber and (B) said first orifice is in fluid communication with said first chamber and said second chamber, (iii) a gas connector which has (A) a passageway defined therethrough, said passageway having an inlet and an outlet and being in direct fluid communication with said first chamber of said interior void and (B) a gas port in fluid communication with said passageway, (iv) a gas dispenser in direct fluid communication with said second chamber of said interior void, (v) an exit port in fluid communication with said interior void of said enclosure, (vi) a gas source containing a gas, said gas source being in fluid communication with said gas port of said gas connector such that said gas contained by said gas source is advanced into said passageway of said gas connector, and (vii) a humidified gas source for providing a humidified gas, said humidified gas source being in fluid communication with said gas dispenser such that said humidified gas is advanced into said gas dispenser and directly into said second chamber of said interior void;
   (b) advancing said etch gas product into said passageway of said gas connector;
   (c) advancing said gas from said gas source into said passageway of said gas connector at the same time said etch gas product is being advanced into said passageway; and
   (d) advancing said humidified gas from said humidified gas source into said second chamber of said interior void.

2. The method of claim 1, further comprising:
   (e) placing an electrical heating element in thermal communication with said gas provided by said gas source; and
   (f) heating said gas provided by said gas source.

3. The method of claim 1, wherein:
   said apparatus further includes a second partition having a second orifice defined therein;
   said second partition is positioned within said second chamber;
   said first orifice has a first central axis;
   said second orifice has a second central axis; and
   said second central axis of said second orifice is offset relative to said first central axis of said first orifice.

4. The method of claim 1, further comprising:
   (g) removing said apparatus from said etch apparatus so that said apparatus is no longer in fluid communication with said etch apparatus; and
   (h) placing said etch apparatus in fluid communication with a replacement apparatus which includes (i) an enclosure which defines an interior void, (ii) a first partition having a first orifice defined therein, said first partition being positioned within said interior void of said enclosure such that (A) said first partition divides said interior void into a first chamber and a second chamber and (B) said first orifice is in fluid communication with said first chamber and said second chamber, (iii) a gas connector which has (A) a passageway defined therethrough, said passageway having an inlet and an outlet and being in direct fluid communication with said first chamber of said interior void and (B) a gas port in fluid communication with said passageway, (iv) a gas dispenser in direct fluid communication with said second chamber of said interior void, (v) an exit port in fluid communication with said interior void of said enclosure, (vi) a gas source containing a gas, said gas source being in fluid communication with said gas port of said gas connector such that said gas contained by said gas source is advanced into said passageway of said gas connector, and (vii) a humidified gas source for providing a humidified gas, said humidified gas source being in fluid communication with said gas dispenser such that said humidified gas is advanced into said gas dispenser and directly into said second chamber of said interior void.

5. The method of claim 1, wherein said etch gas product includes a first gaseous component, further comprising:
   (i) precipitating said first gaseous component in said first chamber of said interior void.

6. The method of claim 5, wherein said etch gas product also includes a second gaseous component, further comprising:
   (j) advancing said second gaseous component through said first orifice of said first partition; and
   (k) precipitating said second gaseous component in said second chamber of said interior void.

7. A method of abating effluent comprising:
   generating an etch gas product in an etching apparatus;
   advancing the etch gas product along a gas connector in fluid communication with the etching apparatus and in fluid communication with an abatement apparatus;
   introducing a first gas into the advancing etch gas product within the gas connector;
   mixing the introduced first gas and the advancing etch gas product within the gas connector;
   advancing the mixed first gas and etch gas product into an interior void of the abatement apparatus;
   precipitating a first portion of the mixed first gas and etch gas product within the interior void; and
   mixing a second gas with the mixed first gas and etch gas product within the interior void after the first portion has been precipitated.

8. The method of claim 7, further comprising:
   heating the first gas prior to introducing the first gas into the advancing etch gas product.

9. The method of claim 7, further comprising:
   humidifying the second gas prior to mixing the second gas with the mixed first gas and etch gas product within the interior void.

10. The method of claim 7, wherein:
    the interior void of the abatement apparatus comprises a first chamber and a second chamber;
    precipitating a first portion of the mixed first gas and etch gas product comprises precipitating the first portion of the mixed first gas and etch gas product within the first chamber; and
    mixing a second gas with the mixed first gas and etch gas product comprises mixing the second gas with the mixed first gas and etch gas product within the second chamber.

11. The method of claim 7, wherein the interior void of the abatement apparatus comprises a first chamber, a second chamber, and a third chamber, the method further comprising:
    advancing all but the first portion of the mixed first gas and etch gas product from the first chamber to the second chamber through a first orifice having a first central axis;
    precipitating a second portion of the mixed second gas, first gas and etch gas within the second chamber; and
    advancing all but the first portion of the mixed first gas and etch gas product and the second portion of the mixed second gas, first gas and etch gas from the second chamber to the third chamber through a second orifice having a second central axis, wherein the first axis is not aligned with the second axis.

12. The method of claim 11, wherein the first central axis is aligned with a central longitudinal axis of the abatement apparatus.

13. A method of abating effluent comprising:
generating an etch gas product in an etching apparatus;
advancing the etch gas product along a gas connector in fluid communication with the etching apparatus and in fluid communication with an abatement apparatus;
introducing a first gas into the advancing etch gas product within the gas connector;
mixing the introduced first gas and the advancing etch gas product within the gas connector;
advancing the mixed first gas and etch gas product into a first chamber of the abatement apparatus;
precipitating all but a first remainder of the mixed first gas and etch gas product within the first chamber;
advancing the first remainder from the first chamber to a second chamber of the abatement apparatus through a first orifice having a first central axis;
humidifying a second gas;
mixing the humidified second gas with the first remainder within the second chamber;
precipitating all but a second remainder of the mixed humidified second gas and first remainder within the second chamber; and
advancing the second remainder from the second chamber to a third chamber of the abatement apparatus through a second orifice having a second central axis.

14. The method of claim 13, further comprising:
heating the first gas prior to introducing the first gas into the advancing etch gas product.

15. The method of claim 13, wherein the first central axis and the second central axis are not aligned.

16. The method of claim 15, wherein the first central axis is aligned with a central longitudinal axis of the abatement apparatus.

* * * * *